Figure 1:
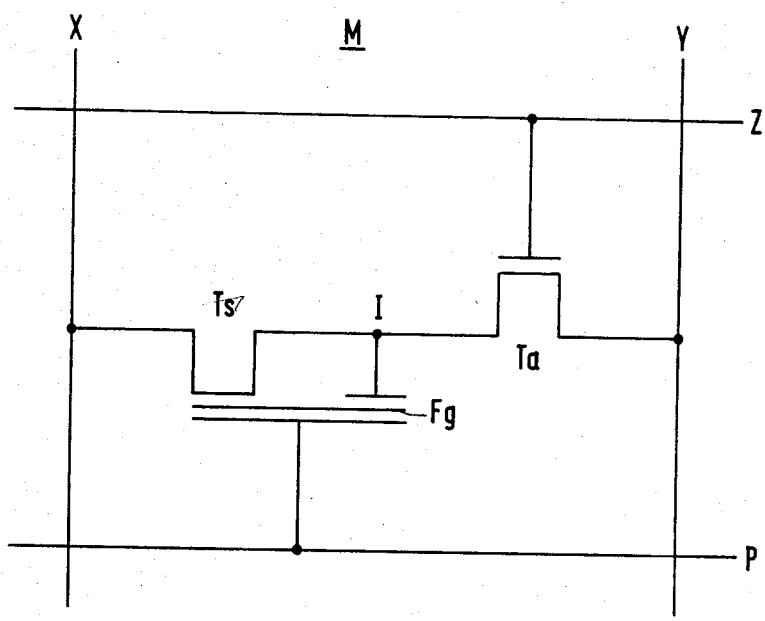

United States Patent [19]

Giebel

[11] Patent Number: 4,527,256
[45] Date of Patent: Jul. 2, 1985

[54] ELECTRICALLY ERASABLE MEMORY MATRIX (EEPROM)

[75] Inventor: Burkhard Giebel, Denzlingen, Fed. Rep. of Germany

[73] Assignee: ITT Industries, Inc., New York, N.Y.

[21] Appl. No.: 470,759

[22] Filed: Feb. 28, 1983

[30] Foreign Application Priority Data

Mar. 17, 1982 [EP] European Pat. Off. ........ 82102142.5

[51] Int. Cl.³ .............................................. G11C 11/40
[52] U.S. Cl. .................................... 365/154; 365/189
[58] Field of Search ............... 365/154, 182, 218, 189, 365/230

[56] References Cited

U.S. PATENT DOCUMENTS 4,441,168  4/1984  Luciw ................................. 365/154
4,441,169  4/1984  Sasaki et al. ....................... 365/154

Primary Examiner—Terrell W. Fears
Attorney, Agent, or Firm—Donald J. Lenkszus

[57] ABSTRACT

EEPROM showing storage cells comprising a tunnel injector which at the one hand is connected to a first bit line by means of the source-drain-line of a floating gate FET and at the other hand to a second bit line by means of the source-drain-line of a selection FET. Interferences between addressed groups and not addressed groups of storage cells during writing are eliminated by means of connection of the first bitline of the not addressed groups via the source-drain-lines of a depletion type FET and an enhancement FET to ground.

9 Claims, 2 Drawing Figures

ELECTRICALLY ERASABLE MEMORY MATRIX (EEPROM)

From the "1980 IEEE International Solid-State Circuits Conference. Digest of Technical Papers", pages 152 and 153 there is known an electrically erasable memory matrix (EEPROM) employing storage cells arranged in n rows and m columns. Each of the storage cells comprises a tunnel injector which is capable of tunnelling electrons through a sufficiently thin oxide layer, in both directions towards an electrically floating gate electrode. The injector of each storage cell is connected, on one hand, via the source-drain line of a memory transistor, to a first bit line and on the other hand, via the source-drain line of a selection FET, to a second bit line, while the control gate of the memory transistor is connected to a programming line. The gate of the selection FET is connected to a row select line via which, in a row-wise manner, the n storage cells of each row can be selected.

In one conventional type of memory matrix employing such types of storage cells, these are arranged in groups of b storage cells each. The storage groups, in turn, are organized in w blocks of b columns each and n rows each. The gates of the w.b=m selection FET's of each row are connected via a common row selection line to each time one of n outputs of a row decoder. The control gates of the b memory transistors of each group, however, are connected to a common programming line and, via the source-drain line of a group selection transistor, are connected in blocks to one common block line. The gate of the group selection transistor is connected to the corresponding row selection line. In this way, a blockwise selection of the groups of each block becomes possible.

Of course, m/b=w is a whole number (integer).

Moreover, in the conventional electrically erasable matrix, the storage cells are contacted in a columnwise manner with each time one throughgoing first and second bit line, and the block line is connected to a block signal source via the source-drain line of a block selection transistor whose gate is connected to one of w outputs of a block decoder, per block. Moreover, the outputs of the block decoder are connected to the gates of b column selection transistors whose source-drain lines, in turn, each time connect one of the second bit lines of each block to one of the data lines.

For realizing the functions "read", "erase" and "write" it is possible with the conventional type of electrically erasable memory matrix to apply the row selection lines, the block lines and the bit lines, with the aid of corresponding decoders, to suitable potentials, with also the address of the memory, of the storage group and of the block having to be selectable, i.e., the aforementioned functions are to be enlarged by the factor 2 in accordance with the address feature "selected" and "nonselected". With the memory matrix according to the invention, apart from the thus resulting six functions, there is still provided a seventh function "inactive", during which none of the aforementioned six functions are realized.

Accordingly, the invention relates to an electrically erasable memory matrix as set forth in the preamble of claim 1.

It was found that with such a memory matrix, during the reprogramming of the selected memory cells or groups, interferences are likely to occur, which affect the information contents of non-selected groups.

It is the object of the invention, therefore, by involving a small circuit investment, to avoid such interferences of non-involved groups during the reprogramming.

The invention is based on the idea of electrically separating the first bit lines from one another.

According to the invention, the above-mentioned object is achieved by taking the measures set forth in the characterizing part of claim 1.

For this purpose there is used a clamping gate consisting of the source-drain parallel arrangement of a transistor of the enhancement type with a transistor of the depletion type. This provides the possibility, according to a signal of an X-clamping signal source Kx, to apply the first bit lines optionally either in a low- or high-ohmic manner to ground. During the writing, the output of the X-clamping signal source is applied to a first potential V1 which is identical or almost identical to the ground potential Vo. In this way, it is safeguarded that during the writing, the first bit lines are high-resistively connected to ground, so that excessive currents at the end of the writing process, and any interferences caused thereby during the reprogramming, in non-selected groups are avoided in a simple way.

Figure 2:
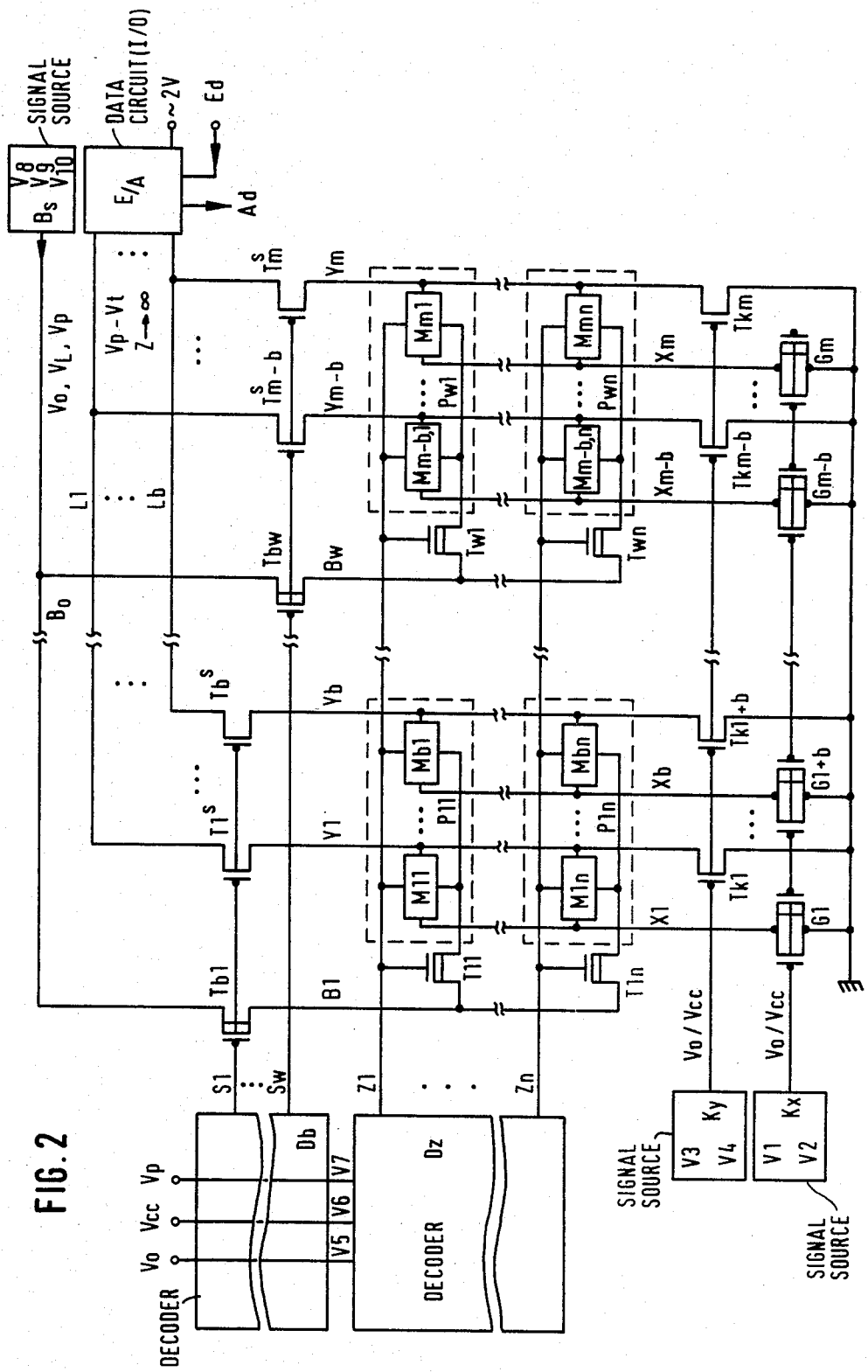

The invention will now be explained with reference to FIGS. 1 and 2 of the accompanying drawings, in which:

FIG. 1 schematically shows the storage cell as used with the memory matrix according to the invention, and FIG. 2 shows the basic circuit diagram of the electrically erasable memory matrix according to the invention.

With the memory matrix according to the invention, for example, it is possible to use a storage cell of the type as described in the technical journal "Electronics" of Feb. 28, 1980, on pages 113 through 117. This storage cell comprises a memory transistor Ts with a potentially floating gate electrode Fg on which, by means of a tunnel oxide area in a thickness of less than 200 Å, and injector I is realized on the drain region of the memory transistor Ts. Through the tunnel oxide area, electrons can be injected in both directions either into or out of the potentially floating gate electrode Fg. The direction of the charge carrier injection merely depends on the potentials of both the control gate Gs of the memory transistor Ts and the drain electrode. A Fowler-Nordheim-tunnelling of electrons by oxides 200 Å thick can already be accomplished with potentials of less than 20 V.

In the storage cell to be employed, there is moreover still provided a selection FET Ta whose gate is connected to a row selection line Z. The control gate Gs of the memory transistor, however, is connected to a programming line P. The source-drain line of the memory transistor Ts is arranged, on the one hand, between the injector I and a first bit line X, whereas, on the other hand, the injector is connected via the source-drain line of the selection FET Ta, to a second bit line Y.

FIG. 2 illustrates the matrix-like arrangement of the storage cells M11 to Mmn, as well as the wiring to the peripheral circuit shown in the form of blocks, which consists of a row decoder Dz, of a block signal source Bs, of a block decoder Db, of an X-clamping signal source Kx, of an Y-clamping signal source Ky, and of a data circuit E/A, (I/0). The storage cells are assembled to groups of b storage cells each, on each time one common programming line P11 . . . Pwn, to which the control gates of the memory transistors are applied. The groups, in turn, are arranged in blocks having each time one common block line B1 . . . Bw and which, via the source-drain line of a group selection transistor T11 . . . Twn, is respectively connected to one programming line P11 . . . Pwn. Preferably, the group selection transistors, just like the block selection transistors Tb1 . . . Tbw, are designed as insulated-gate field-effect transistors of the depletion type. The last mentioned transistors connect in a blockwise fashion, the block lines B1 . . . Bw to the block signal source Bs. The selection of one of the rows is accomplished with the aid of the row decoder Dz via the respective one of the row selection lines Z1 . . . Zn which is connected to the gates of the group selection transistors T11 . . . Twn, as well as to the gate electrodes of the selection transistors Ta of the associated row.

The blocks, however, are selected with the aid of the block decoder Db, with the outputs S1 . . . Sw thereof being connected to the gates of the associated block selection transistors Tb1 . . . Tbw, as well as in blocks to the gates of b column selection transistors $T1^s$ . . . $Tm^s$. Via the source-drain lines of the last-mentioned column selection transistors it is possible for the second bit lines Y1 . . . Ym of a block to be optionally connected to the data lines L1 . . . Lb of the data circuit E/A (I/0) via which the data are fed in and read out. Quite depending on the selected group address and the function "write" or "read", there is available on the data lines the potential Vp−Vt (Vt=threshold voltage) as used for the writing operation. In the case of the "read", the data lines are connected to a read (sense) amplifier which supplies a constant voltage of approximately 2 V, as is shown in FIG. 2. The data circuit E/A (I/0), moreover, comprises the data input Ed and the data output Ad.

According to the invention, there is arranged between each of the m first bit lines X1 . . . Xm and ground, the switching section of one of m clamping gates G1 . . . Gm. Each clamping gate contains the source-drain parallel arrangement of a field-effect transistor of the enhancement type with a field-effect transistor of the depletion type. One such clamping gate provides the possibility to apply the individual first bit lines X1 . . . Xm optionally either in a high- or low-ohmic manner to ground. The potentials required to this end, for V1 identical or almost identical to the ground potential Vo, or else for V2 identical or almost identical to the operating potential Vcc, are supplied by the X-clamping signal source Kx.

Since in the event of the erasure, the second bit lines Y1 . . . Ym have to be applied to ground, one of the clamping transistors Tk1 . . . Tkm is connected to each of the second bit lines Y1 . . . Ym, with the gates of the clamping transistors being controlled by a Y-clamping signal source Ky in accordance with V3≃Vo or V4≃Vcc.

The potentials as made available by the peripheral circuit blocks of the memory matrix according to the invention and in accordance with the chosen function mode, result from the following table:

|  | Read | | Erase | | Write | | |
| --- | --- | --- | --- | --- | --- | --- | --- |
|  | M(1) | M(0) | M(1) | M(0) | M(1) | M(0) | Inactive |
| Z1 . . . Zn | ∼Vcc | ∼Vo | ∼Vp | ∼Vo | ∼Vp | ∼Vo | ∼Vcc |
| S1 . . . Sw | ∼Vcc | ∼Vo | ∼Vp | ∼Vo | ∼Vp | ∼Vo | ∼Vcc |
| L1 . . . Lb | Sense Amplifier from E/A (I/0) | | high-ohmic | | ∼Vp-Vt | high-ohmic | high-ohmic |
| Bo | ∼$U_L$ | | ∼Vp | | ∼Vo | | ∼0 |
| Kx | ∼Vcc | | ∼Vcc | | ∼Vo | | ∼Vcc |
| Ky | ∼Vo | | ∼Vcc | | ∼Vo | | ∼Vcc |

In this table the potentials mentioned under M (1) refer to values as appearing in the circuit elements or lines as indicated in column 1, in case of a selected cell, and the values indicated under M (0) refer to the non-selected cell. Accordingly, during the writing, the potential V7=Vp of the programming voltage source is applied to the row selection line Z as well as to the block selection line S of the respective cell, with the potential Vp-Vt being applied to the respective data line. On the associated block line B there appears the potential Vp of the programming voltage source, whereas the X-clamping signal source Kx as well as the Y-clamping signal source Ky supply a potential near that of the ground potential, so that the associated clamping transistor is blocked, and the respective clamping gate comprises a source-drain resistance corresponding to the high-ohmic resistance of the field-effect transistor of the depletion type.

The block decoder Db contains w NOR decoder circuit parts whose outputs are connected to the individual block selection lines S1 . . . Sw. At this, as already denoted in FIG. 2, and in accordance with the functions of the foregoing table, there may appear the potentials V5 identical or almost identical to the ground potential Vo, the potential V6, identical or almost identical to the operating potential Vcc, or the potential V7 corresponding to the potential Vp of the programming voltage source, and the same applies to the row decoder Dz. At its output Bo, the block signal source Bs optionally makes available one of three potentials, i.e. V8 identical or almost identical to the ground potential Vo, V9 identical to the read voltage $V_L$, or V10 identical to the potential Vp of the programming voltage source.

In order to safeguard a long as possible data retention time, the potentials at the terminals of the storage cells should be kept as close as possible to Vo during the read-out processes and during the operating intervals. In further embodying the memory matrix according to the invention, a read voltage $V_L$ can be chosen to be identical to the ground potential Vo, in cases where the memory transistors Ts on the substrate surface below the control gate, have such a concentration of dopings of the conductivity type of the source or drain regions, that prior to the first programming of the cells, in one such cell with the programming lines applied to ground potential, and first bit lines when applying a potential against ground to the second bit lines, a current will respectively flow through the source-drain line of the individual cells.

The extensive interference immunity of a memory matrix according to the invention and as shown in FIG. 2 results from the fact that during the re-programming processes the potential on the programming lines P of non-selected groups is a potential corresponding in the utmost to the amount of the application voltage of a group selection transistor T11 . . . Twn of about 3 V, and that on the first bit line X there may appear a potential corresponding in the utmost to the application voltage of a "written", hence of a memory transistor set to the logic zero, of about 7 V. It is moreover safeguarded that on the row selection lines Z1 . . . Zn there appears a re-programming potential amounting to the supply voltage Vp and, on the second bit lines Y1 . . . Ym, a reprogramming potential amounting to the supply voltage Vp reduced by an application voltage of about 3 V of the involved field-effect transistor of the depletion type, i.e., at the smallest current intake from the supply source.

I claim:

1. Electrically erasable memory matrix (EEPROM) comprising storage groups arranged in w blocks with b columns each and arranged in n rows, with b electrically re-programmable storage cells each, with each of the storage cells containing each time one tunnel injector (I) which is effective in both directions and towards each time one electrically floating gate electrode (Fg) and which, on the one hand, via the source-drain line of a memory transistor (Ts) is connected to a first bit line (X) and, on the other hand, via the source-drain line of a selection transistor (Ta), is connected to a second bit line (Y), with the control gate of the memory transistor being connected to a programming line (P) while the gate of the selection transistor (Ta) is contacted to a row selection line (Z), in which memory matrix the gates of the w.b=m selection transistors (Ta) of each row, via one common row selection line (Z1 . . . Zn) are connected to each time one of n outputs of a row decoder (Dz), the control gates of the b memory transistors (Ts) of each group are connected to one common programming line (P11 . . . Pwn) and, via the source-drain line of a group selection transistor (T11 . . . Twn) whose gate is connected to the corresponding common row selection line (Z1 . . . Zn) are connected in blocks to one common block line (P1 . . . Pw), with m/b=w being a whole number (integer), the storage cells are contacted in a columnwise manner to each time one continuous, common first and second bit line (X1 . . . Xm; Y1 . . . Ym), the block lines (B1 . . . Bw) are connected to a block signal source (Bs) via the source-drain line of a block selection transistor (Tb1 . . . Tbw) per block, with the gates thereof being connected to one of w outputs (S1 . . . Sw) of the block decoder (Db), the outputs (S1 . . . Sw) of said block decoder (Db) are each connected in blocks to the gates of b column selection transistors (T1$^s$ . . . Tb$^s$; Tm-b$^s$ . . . Tm$^s$) whose source-drain lines, in turn, connect each time one of the second bit lines (Y1 . . . Yb; . . . ;Ym-b . . . Ym) of each block to one of the data lines (L1 . . . Lb), and the row selection line (Z1 . . . Zn), the block line (B1 . . . Bw), the first bit lines (X1 . . . Xm) and the second bit lines (Y1 . . . Ym) are capable of being connected to suitable potentials in accordance with a first function "Reading Selected", a second function "Reading Not Selected", a third function "Erasing Selected", a fourth function "Erasing Not Selected", a fifth function "Writing Selected", a sixth function "Writing Not Selected", or a seventh function "Inactive", characterized in that between said m first bit lines (X1 . . . Xm) and ground, there are arranged the switching sections of each time one of m clamping gates (G1 . . . Gm), with one clamping gate consisting of a source-drain parallel arrangement of a transistor of the enhancement type and of one transistor of the depletion type, and that the gates of all of said clamping gates (G1 . . . Gm) are jointly controlled by one X-clamping signal source (Kx) in such a way that a first potential (V1) identical or almost identical to the ground potential (Vo) according to the fifth function or the sixth function, or else a second potential (V2) identical or almost identical to the operating potential (Vcc) corresponding to the first through fourth or seventh function can be set randomly.

2. An electrically erasable memory matrix as claimed in claim 1, characterized in that said memory transistors (Ts), on the substrate surface below the control gates, show to have such a doping concentration of dopants of the conductivity type of the source-drain regions, that prior to the first programming of said memory transistors, in the case of programming lines (P11 . . . Pwn) and first bit lines X1 . . . Xm) connected to ground potential, and when applying a potential against ground to said second lines (Y1 . . . Ym), currents will flow through said memory transistors.

3. An electrically erasable memory matrix as claimed in claim 2, characterized in that by said block signal source (Bs) in accordance with either said first or said second function ("Reading") there is provided a potential close to or equal to said ground potential (Vo).

4. An electrically erasable memory matrix as claimed in claim 1, characterized in that said individual block selection lines (S1 . . . Sw) which are connected to the gate electrodes of block selection transistors (Tb1 . . . Tbw) of the depletion type, and to the gate electrodes of column selection transistors (T1$^s$ . . . Tm$^s$) of the enhancement type, are capable of being controlled by each time one NOR decoder circuit of said block decoder (Db), and that the individual row selection lines (Z1 . . . Zm) which are connected to the gate electrodes of said group selection transistors (T11 . . . Twn) and to those of said selection transistors (Ta), are capable of being controlled by each time one NOR decoder circuit of said row decoder (Dz), i.e., in accordance with said second, fourth or sixth function, by a fifth potential (V5) identical or almost identical to the ground potential (Vo), in accordance with the first or seventh function, by a sixth potential (V6) identical or almost identical to the operating potential (Vcc), or in accordance with the third or fifth function, by a seventh potential (V7) identical or almost identical to the programming voltage (Vb).

5. An electrically erasable memory matrix as claimed in claim 2, characterized in that said individual block selection lines (S1 . . . Sw) which are connected to the gate electrodes of block selection transistors (Tb1 . . . Tbw) of the depletion type, and to the gate electrodes of column selection transistors (T1$^s$ . . . Tm$^s$) of the enhancement type, are capable of being controlled by each time one NOR decoder circuit of said block decoder (Db), and that the individual row selection lines (Z1 ... Zm) which are connected to the gate electrodes of said group selection transistors (T11 ... Twn) and to those of said selection transistors (Ta), are capable of being controlled by each time one NOR decoder circuit of said row decoder (Dz), i.e., in accordance with said second, fourth or sixth function, by a fifth potential (V5) identical or almost identical to the ground potential (Vo), in accordance with the first or seventh function, by a sixth potential (V6) identical or almost identical to the operating potential (Vcc), or in accordance with the third or fifth function, by a seventh potential (V7) identical or almost identical to the programming voltage (Vb).

6. An electrically erasable memory matrix as claimed in claim 3, characterized in that said individual block selection lines (S1 ... Sw) which are connected to the gate electrodes of block selection transistors (Tb1 ... Tbw) of the depletion type, and to the gate electrodes of column selection transistors (T1$^s$ ... Tm$^s$) of the enhancement type, are capable of being controlled by each time one NOR decoder circuit of said block decoder (Db), and that the individual row selection lines (Z1 ... Zm) which are connected to the gate electrodes of said group selection transistors (T11 ... Twn) and to those of said selection transistors (Ta), are capable of being controlled by each time one NOR decoder circuit of said row decoder (Dz), i.e., in accordance with said second, fourth or sixth function, by a fifth potential (V5) identical or almost identical to the ground potential (Vo), in accordance with the first or seventh function, by a sixth potential (V6) identical or almost identical to the operating potential (Vcc), or in accordance with the third or fifth function, by a seventh potential (V7) identical or almost identical to the programming voltage (Vb).

7. An electrically erasable memory matrix as claimed in claim 2, characterized in that between said second bit line (Y1 ... Ym) and ground there is each time arranged one source-drain line of one of m clamping transistors (Tk1 ... Tkm), and that the gates of all of said clamping transistors (Tk1 ... Tkm), by one Y-clamping signal source (Ky) are capable of being connected either in accordance with the first, second, fifth or sixth function, to a third potential (V3) identical or almost identical to the ground potential (Vo) or else in accordance with the third, fourth, or seventh function, to a fourth potential (V4) which is identical or almost identical to the operating potential (Vcc).

8. An electrically erasable memory matrix as claimed in claim 3, characterized in that between said second bit line (Y1 ... Ym) and ground there is each time arranged one source-drain line of one of m clamping transistors (Tk1 ... Tkm), and that the gates of all of said clamping transistors Tk1 ... Tkm), by one Y-clamping signal source (Ky) are capable of being connected either in accordance with the first, second, fifth or sixth function, to a third potential (V3) identical or almost identical to the ground potential (Vo) or else in accordance with the third, fourth, or seventh function, to a fourth potential (V4) which is identical or almost identical to the operating potential (Vcc).

9. An electrically erasable memory matrix as claimed in claim 4, characterized in that between said second bit line (Y1 ... Ym) and ground there is each time arranged one source-drain line of one of m clamping transistors (Tk1 ... Tkm), and that the gates of all of said clamping transistors (Tk1 ... Tkm), by one Y-clamping signal source (Ky) are capable of being connected either in accordance with the first, second, fifth or sixth function, to a third potential (V3) identical or almost identical to the ground potential (Vo) or else in accordance with the third, fourth, or seventh function, to a fourth potential (V4) which is identical or almost identical to the operating potential (Vcc).

* * * * *